United States Patent [19]
Rodriguez, II et al.

[11] Patent Number: 5,118,236
[45] Date of Patent: Jun. 2, 1992

[54] FLOATING CENTER TAPPED SHOULDER SCREW

[75] Inventors: Noé E. Rodriguez, II, Severna Park; James L. Moser, Pasadena; Herman Rossman, Randallstown, all of Md.

[73] Assignee: The United States of America as represented by the Secretary of the Air Force, Washington, D.C.

[21] Appl. No.: 664,251

[22] Filed: Mar. 4, 1991

[51] Int. Cl.$^5$ .............................................. F16B 35/00
[52] U.S. Cl. ................................... 411/378; 411/383; 411/389; 411/395
[58] Field of Search ............. 411/395, 396, 378, 383, 411/385, 388, 389, 411, 424; 439/584, 585

[56] References Cited

U.S. PATENT DOCUMENTS

| | | | |
|---|---|---|---|
| 4,580,862 | 4/1986 | Johnson | 339/64 R |
| 4,697,859 | 10/1987 | Fisher, Jr. | 439/246 |
| 4,820,180 | 4/1989 | Mosquera et al. | 439/248 |
| 4,824,388 | 4/1989 | Pickel | 439/248 |

FOREIGN PATENT DOCUMENTS

| | | | |
|---|---|---|---|
| 493139 | 7/1955 | Italy | 411/396 |
| 587231 | 1/1959 | Italy | 411/378 |
| 674667 | 6/1990 | Switzerland | 411/396 |
| 700704 | 11/1979 | U.S.S.R. | 411/378 |
| 315182 | 7/1929 | United Kingdom | 411/389 |

Primary Examiner—Rodney M. Lindsey
Attorney, Agent, or Firm—Robert L. Nathans; Donald J. Singer

[57] ABSTRACT

A shoulder screw having a centrally positioned borehole concentric with respect to the longitudinal axis of the screw and a cylindrical center-tapped bolt receiver loosley positioned within the centrally positioned borehole of the shoulder screw and coupled thereto by a roll pin positioned perpendicularly with respect to the axis of said shoulder screw, the diameter of the bolt receiver being less than the diameter of the borehole, for enabling the bolt receiver to translate in a direction transverse to the axis of the shoulder screw.

1 Claim, 1 Drawing Sheet

FLOATING CENTER TAPPED SHOULDER SCREW

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of fasteners and more particularly to fasteners for connecting electrical modules to chassis racks.

In the design of electronic communication modules affixed to chassis racks, connector plates have been used to accommodate a should screw and an adjacent tapped hole for threaded male wedgelock insertion therein. In prior designs, the connector plate had a width of about one inch so that there was ample room to separately mount the shoulder screw and the wedgelock receiver having the tapped hole therein.

However, in order to minimize weight and component sizes, the width of the connector plate was reduced, so that there was insufficient room to place the shoulder screw and the wedgelock receiver side by side across the width of the connector plate.

SUMMARY OF THE INVENTION

The aforesaid problem was solved by providing a simple three piece device which retains the shoulder screw and wedgelock receiver in a compact package and which easily fits across the width of the connector plate having the reduced width. The shoulder screw is configured to accommodate the wedgelock receiver concentrically therein, and a pin is passed through the shoulder screw and wedgelock receiver to prevent rotation of the wedgelock receiver during module insertion and to hold the two components together.

BRIEF DESCRIPTION OF THE DRAWING

Other objects, features and advantages of the invention will become apparent upon study of the following description, taken in conjunction with the drawing in which.

SPECIFIC DESCRIPTION

Figure 1:
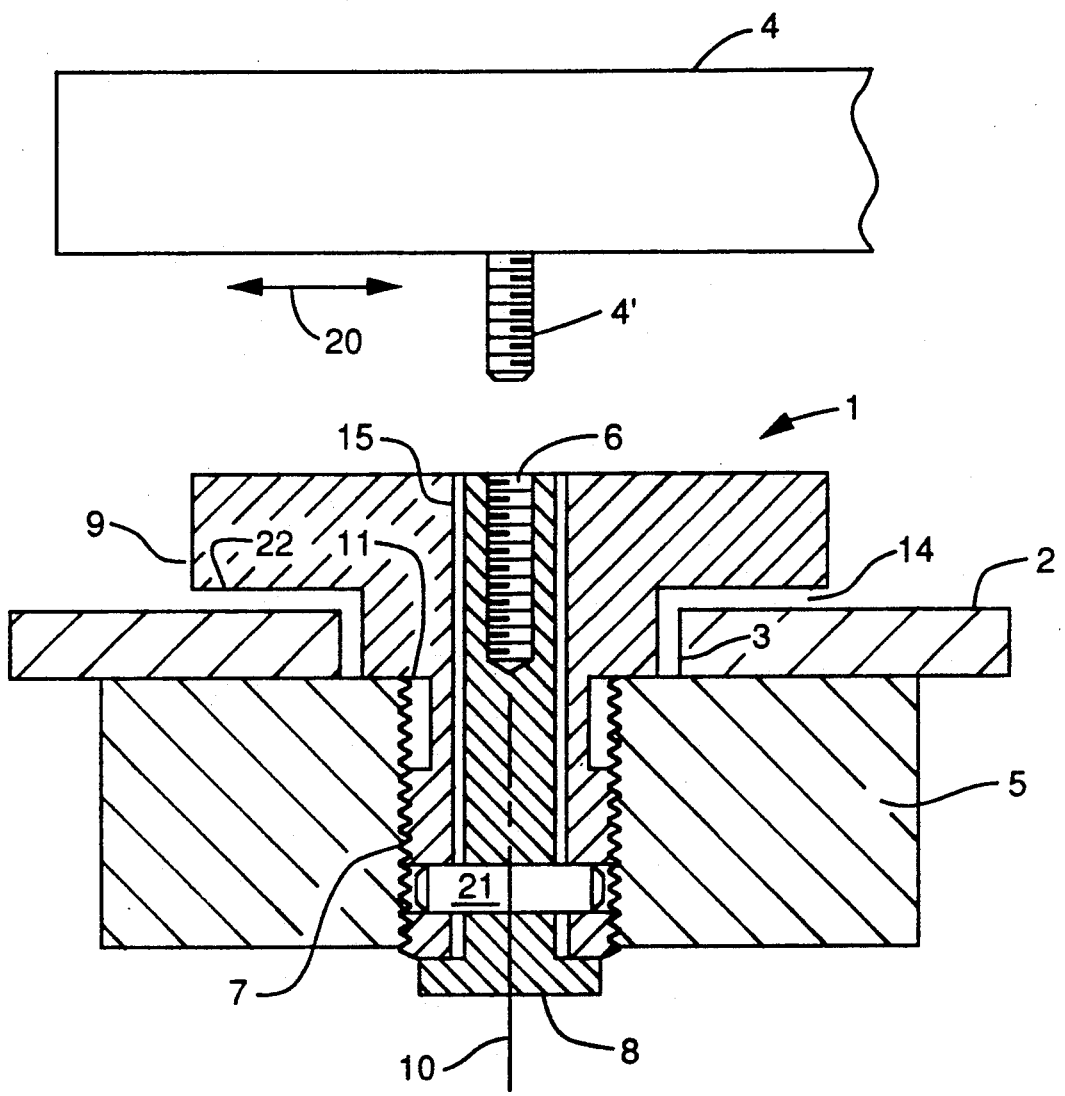
FIG. 1 shows a cross-sectional view of a preferred embodiment of the invention.

As a matter of background, connector plate 2 is affixed to a rack assembly, not shown, which rack assembly carries a substrate 5 for receiving shoulder screw 1. Module 4 has two threaded male wedgelock screws 4', only one of which is shown. Each wedgelock screw is screwed into an associate threaded hole 6 of wedgelock receiver 8, only one being shown.

As is well known, the connector plate bears RF and input/output connectors which mate with complementary connectors affixed to module 4. It is also well known that when the male members 4' are screwed into the wedgelock receivers, the module must be allowed to translate in a direction perpendicular to the longitudinal axis 10 of the wedgelock receiver.

Cylindrical wedgelock receiver 8 is inserted into a centrally positioned shoulder screw borehole 15, and roll pin 21 is force fitted into a hole extending through the lower threaded portion of the shoulder screw, and cylindrical wedgelock receiver 8 as shown. Terminal portions of the roll pin are positioned completely within the threaded lower portion of the shoulder screw, which is now screwed into the threaded hole 7 within substrate 5, until an annular shoulder screw portion 11 presses against the upper surface of substrate 5 as shown in the figure.

It should be noted that the distance between the lower surface 22 of screw head 9 and annular shoulder portion 11 is greater than the thickness of the connector plate 2 so that the connector plate may "float" with respect to the upper surface of substrate 5. The reason for this is beyond the scope of the present invention. Note that gap 14 is formed between screw head 9 and the upper surface of the connector plate. Also note that hole 3 in connector plate 2 has a greater diameter than the shoulder screw portion just below screw head 9.

Annular gap 15 is formed since the diameter of cylindrical wedgelock receiver 8 is less than the internal diameter of shoulder screw borehole 15. This gap facilitates lateral translation of the module 4 indicated by arrow 20 which is necessary to accommodate the wedgelock action upon insertion of the module into the wedgelock receiver.

It should now be apparent that the aforesaid unacceptable side by side arrangement of the wedgelock receiver and the shoulder screw upon the connector plate is eliminated by a compact component design involving concentrically positioning the cylindrical wedgelock receiver within the cylindrical borehole of the shoulder screw.

Clearly, many modifications and variations of the present invention are possible in light of the above teachings and it is therefore understood, that within the inventive scope of the inventive concept, the invention may be practiced otherwise than specifically claimed.

What is claimed is:

1. A floating center tapped shoulder screw comprising:
   (a) a shoulder screw having an annular shoulder portion for contacting an upper surface of a substrate and oriented perpendicular with respect to a longitudinal axis of said shoulder screw and wherein said shoulder screw has a centrally positioned borehole concentric with respect to said circular head portion; and
   (b) a cylindrical center-tapped bolt receiver loosely positioned within the centrally positioned borehole of said shoulder screw and coupled to said shoulder screw by a roll pin positioned perpendicularly with respect to the longitudinal axis of said shoulder screw, the diameter of said bolt receiver being less than the diameter of said borehole, for enabling said bolt receiver to translate in a direction transverse to the longitudinal axis of said shoulder screw.

* * * * *